United States Patent

Morita et al.

[11] Patent Number: 5,278,137
[45] Date of Patent: Jan. 11, 1994

[54] $YBA_2CU_3O_{7-y}$ TYPE OXIDE SUPERCONDUCTIVE MATERIAL CONTAINING DISPERSED $Y_2BACUO_5$ PHASE AND HAVING HIGH CRITICAL CURRENT DENSITY

[75] Inventors: Mitsuru Morita; Katsuyoshi Miyamoto; Masato Murakami; Shoichi Matsuda, all of Kawasaki, Japan

[73] Assignee: Nippon Steel Corporation, Tokyo, Japan

[21] Appl. No.: 735,105

[22] PCT Filed: Jun. 6, 1989

[86] PCT No.: PCT/JP89/00577

§ 371 Date: Jan. 31, 1990

§ 102(e) Date: Jan. 31, 1990

[87] PCT Pub. No.: WO89/12028

PCT Pub. Date: Dec. 14, 1989

Related U.S. Application Data

[63] Continuation-in-part of Ser. No. 460,070, Jan. 31, 1990, abandoned.

[30] Foreign Application Priority Data

Oct. 19, 1988 [JP] Japan .................. 63-261607
Jun. 6, 1989 [JP] Japan .................. 63-137464

[51] Int. Cl.$^5$ .............. H01L 39/12; H01B 12/00; C01F 17/00
[52] U.S. Cl. ............... 505/1; 505/780; 505/733; 252/521; 423/604; 501/123
[58] Field of Search ............ 505/1, 733, 780; 252/518, 521; 423/593, 604; 501/123

[56] References Cited

U.S. PATENT DOCUMENTS

| | | | |
|---|---|---|---|
| 4,929,595 | 5/1990 | Wu | 505/1 |
| 4,937,225 | 6/1990 | Kalonji et al. | 505/1 |
| 4,956,336 | 9/1990 | Salama et al. | 505/1 |
| 4,970,195 | 11/1990 | Bhargava et al. | 505/1 |
| 4,971,946 | 11/1990 | Taylor et al. | 505/1 |
| 4,994,437 | 2/1991 | Torii et al. | 505/1 |
| 5,077,272 | 12/1991 | Chen et al. | 505/1 |
| 5,084,436 | 1/1992 | Morimoto et al. | 505/1 |

OTHER PUBLICATIONS

Jin et al, "High Critical Currents in Y-Ba-Cu-O Superconductors", *Appl. Phys. Lett.* vol. 52, No. 24, 13 Jun. 1988, pp. 2074-2076.

Hirano et al, "Thermal Behaviour of Melt-Quenched Products of $YBa_2Cu_3O_{7-\delta}$ Compound", *Jrnl. Ceram. Soc. Jap.* vol. 96, No. 4, 1 Apr. 1988, pp. 509-511.

Kaiser et al, "Growth of $YBa_2Cu_3O_x$ Single Crystals", *Appl. Phys Lett.* vol. 51, No. 13, 28 Sep. 1987, pp. 1040-1042.

Jin et al, "Fabrication of Dense $Ba_2YCu_3O_{7-\delta}$ Superconductor Wire by Molten Oxide Processing," *Appl. Phys. Let* vol. 51, No. 12, 21 Sep. 1987, pp. 943-945.

Sawano et al., "Effects of Synthesis Conditions . . . ", *Nip. Ser. Ky. Gak. Ron.* 97(10), pp. 1028-1033, 1989.

Japanese Journal of Applied Physics, vol. 27, No. 4 (Apr. 1988) (Tokyo)[Preparation of High-Tc Superconducting Bi-Ca-Sr-Cu-O Ceramics by the Melt Quenching Method] pp. L533-L535.

(List continued on next page.)

*Primary Examiner*—Paul Lieberman
*Assistant Examiner*—Bradley A. Swope
*Attorney, Agent, or Firm*—Kenyon & Kenyon

[57] ABSTRACT

The present invention is characterized in that oxides of Y, Ba and Cu having a superconductive substance-forming composition are melted, the melt is rapidly cooled and solidified, the obtained sheet is heated at a temperature of 1000° to 1350° C. to produce a partially melted state thereof, and the sheet is gradually cooled at a rate lower than 200° C./hr, whereby a texture in which grains of the $RE_2BaCuO_5$ phase having a diameter smaller than 20 μm are dispersed in the $REBa_2Cu_3O_{7-y}$ phase is obtained.

1 Claim, 5 Drawing Sheets

123 PHASE
211 PHASE
10 μm

OTHER PUBLICATIONS

Journal of the American Ceramic Society, vol. 71, No. 5(1988) Patricia A. Morris. et al [Melt Growth of High-Critical-Temperature Superconducting Fibers] pp. 334-337.

Japanese Journal of Applied Physics vol. 26, No. 5(May 1987) [Superconductivity above 90 K in Y-Ba-Cu-O Compounds and Their Critical Densities at 77 K] pp. L624-L626.

Japanese Journal of Applied Physics vol. 26, No. 5(May 1987) [Critical Current Density of Wire Type Y-Ba-Cu Oxide Superconductor] pp. L865-L866.

Japanese Journal of Applied Physics vol. 26, No. 5(May 1987) [Single Crystal Preparation of $Ba_2YCu_3O_x$ from Nonstoichiometric Melts] pp. L851-L853.

"Melt-processible rare earth-Ba-Cu-O superconductors based on molten Ba-Cu oxides", in 51 Applied Physics Letters, No. 22 (Nov. 30, 1987) pp. 1854-1856.

FIG. 4

# YBA₂CU₃O₇₋ᵧ TYPE OXIDE SUPERCONDUCTIVE MATERIAL CONTAINING DISPERSED Y₂BACUO₅ PHASE AND HAVING HIGH CRITICAL CURRENT DENSITY

This is a continuation-in-part of application Ser. No. 07/460,070, filed Jan. 31, 1990, now abandoned.

TECHNICAL FIELD

The present invention relates to a $YBaCu_3O_{7-y}$ type oxide superconductive material having a high critical current density even in a high magnetic field, and a process for the preparation of this oxide superconductive material by which a superconductive crystal having dispersed fine precipitates of a $Y_2BaCuO_5$ phase is obtained in a partially melted state at a high temperature.

BACKGROUND ART

Current research into the utilization of oxide superconductive materials is directed to the sintering process (see Jap. J. Appl. Phys., Vol. 26, No. 5, 1987, pages L624 through L626). According to this process, starting powders (RE, i.e., a rare earth element including Y and oxides or carbonates of Ba and Cu) are mixed at a predetermined composition of $REBa_2Cu_3O_7$, the mixture is calcined to form a calcined powder having a structure of $REBa_2Cu_3O_{7-y}$, and this calcined powder is then molded and sintered to obtain a superconductive material. As an application of this process, there can be mentioned research by Toshiba into the forming of a wire by packing the calcined powder into a metal cover or the like (Jap. J. Appl. Phys., Vol. 26, No. 5, 1987, pages L865 and L866). Moreover, a process has been attempted in which the calcined powder is molded into a plate and the plate is sintered to obtain a shielding material. These trials, however, have not been practically utilized because the critical current density of the sintered body is low.

The process in which the starting material is heat-melted at a high temperature and gradually cooled is not used for the preparation of a superconductive material, although used for the growth of a single crystal. In this case, in general, the starting powder containing a considerable excess of Cu or CuBa is grown in an alumina crucible. As a typical instance there can be mentioned research by NTT (Jap. J. Appl. Phys., Vol. 26, No. 5, 1987, pages L851 through L853).

In currently available superconductive materials such as sintered bodies, only current densities of several thousand A/cm² are obtained at a temperature of 77 K. and an external magnetic field He of O T (Tesla), and thus they cannot be put to practical use. For a practical utilization, the current density must be increased to about $10^4$ A/cm² at a temperature of 77 K. and an He of several T.

An object of the present invention is to improve the characteristics by using a melting process different from the conventional process for the production of a superconductive material, and to make it possible to practically utilize a superconductive material of the $YBa_2Cu_3O_{7-y}$ phase (hereinafter referred to as "123 phase").

The main problems to be solved to enable a practical utilization are as follows.

1) Improvement of the current density (Jc) in a zero magnetic field and a magnetic field.

2) Improvement of the shapeability into a wire, a coil, a plate and the like.

3) Improvement of the mechanical strength.

In a sintered body obtained according to the conventional sintering process, since the particle size is as fine as several microns to several hundred microns, many grain boundaries exist in the interior of the sintered body: These grain boundaries have a weak superconductivity, and a large superconductive current in particles is restricted and reduced at the grain boundaries. Accordingly, in the sintered body, the Jc is small, and is greatly reduced to scores of A/cm² in a magnetic field. Furthermore, processing of the sintered body after the sintering and bonding of sintered bodies, is very difficult, and moreover, the sintered body is defective in that it is inherently brittle.

DISCLOSURE OF THE INVENTION

The present invention solves the foregoing problems and provides a high-quality oxide superconductive material and a process for the preparation thereof.

Figure 1A:
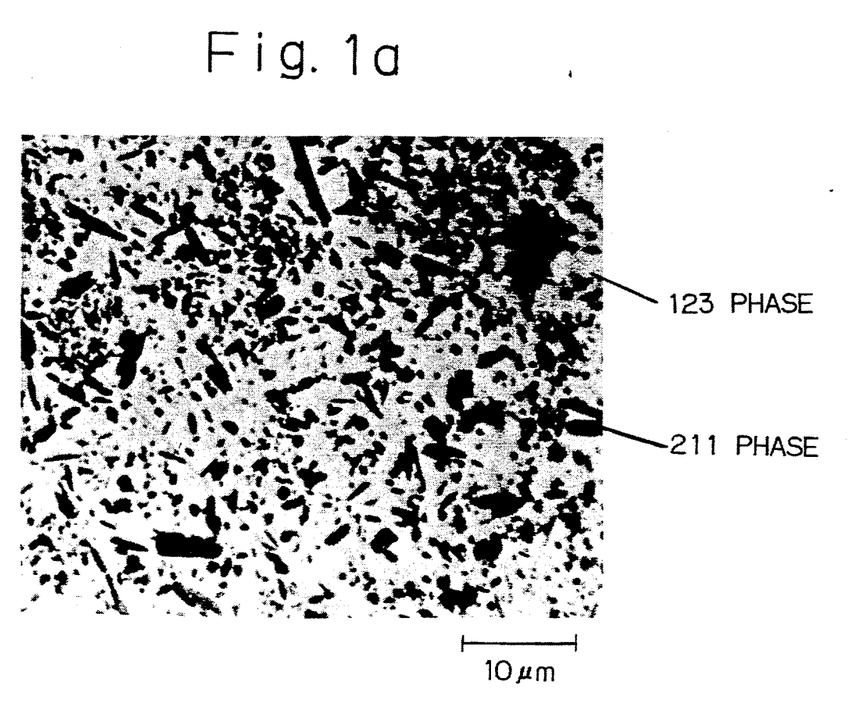
FIG. 1 is a microscope photo showing the micro structure of the superconductive material of the present invention, in which (a) shows the micro structure of the superconductive material, (b) shows the twin crystal of the superconductive material, and (c) shows the micro structure of the intermediate substance of the non-superconductive material.
Figure 1B:
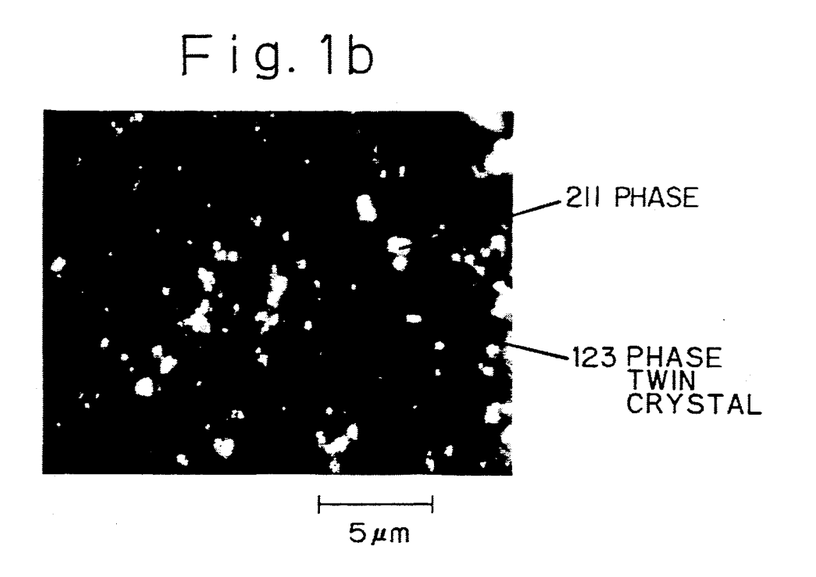
Figure 1C:
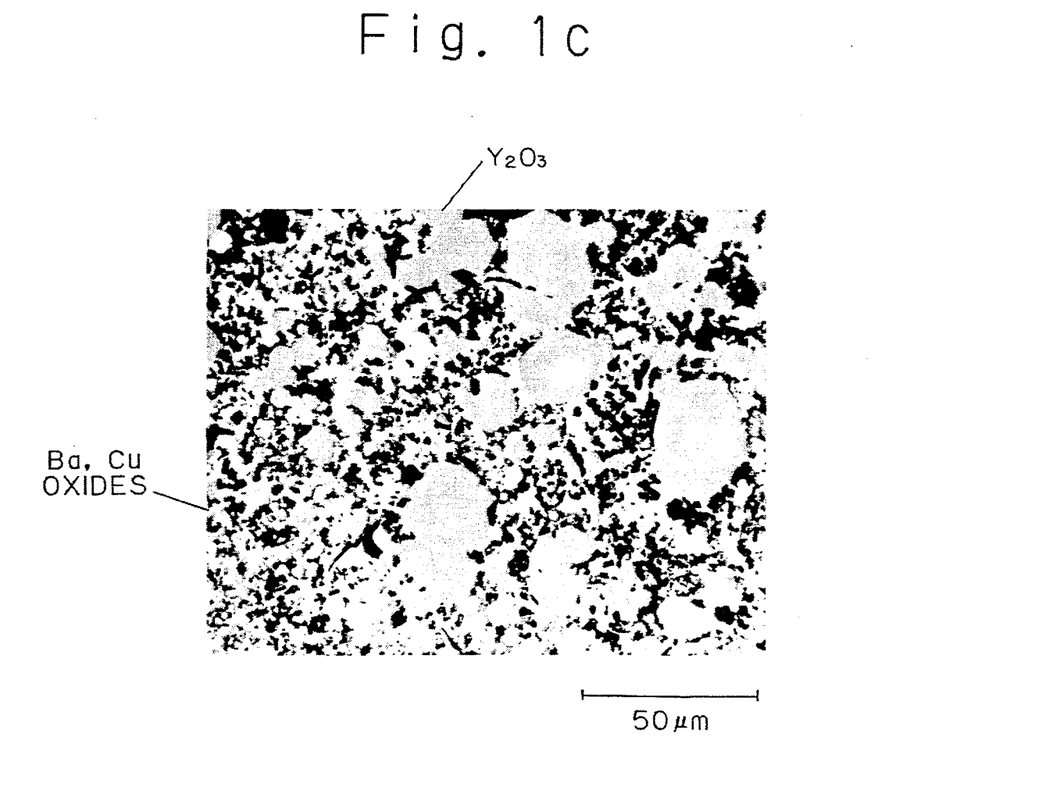

A 123 phase type oxide superconductive material having a high critical current density (Jc) in a zero magnetic field and a magnetic filed has a texture as shown in FIG. 1(a). An element ratio of (Y:Ba:Cu) of this structure is about (12:18:25). Namely, precipitates of the $Y_2BaCuO_5$ phase (hereinafter referred to as "211 phase") having a diameter smaller than 20 μm are dispersed in the texture of matrix 123 phase. A volume ratio of the 211 phase to the whole oxide material (123 phase and 211 phase) is about 35%. The intermediate substance just after the solidification and before the heat treatment has a microstructure, as shown in FIG. 1(c), in which grains of $Y_2O_3$ having a diameter smaller than 50 μm are dispersed in BaCu oxide, i.e., an oxide of a Ba and Cu. This intermediate substance is an oxide non-superconductive material. The texture of the superconductive material for the final product after partial melt treatment, the other example of the present invention, consists of 123 single crystal of several mm in size containing a fine 211 phase. The twin pattern illustrated in FIG. 1(b) is parallel. FIG. 1(b) indicates that matrix of 123 phase is single crystal. An element ratio of (Y:Ba:Cu) of this structure is about (1:2:3) and a volume ratio of the 211 phase to the whole oxide material is about 5%. It is also seen that the 211 phase is present in the superconductive phase. The presence of a certain quantity of this 211 phase is necessary for obtaining a material in which the quantities of grain boundaries, cracks, and a second phase other than the 211 phase, for example, the CuO phase, are reduced, and preferably the 211 phase is finely dispersed. This texture is obtained by heating the intermediate having the microstructure shown in FIG. 1(c) at a temperature of 1000° to 1350° C., to form a fine acicular 211 phase, and then gradually cooling.

Namely, the fine acicular 211 phase forms the 123 phase with the liquid phase by a peritectic reaction, in a gradual cooling, and a part of the above 211 phase remains in a dispersed state in the 123 phase.

As the process for preparing an oxide superconductive material having the above-mentioned texture, there is provided a process in which a plate, coil or wire having a thickness of several mm, which is obtained by a rapid cooling from the molten state and contains oxides of Y, Ba and Cu elements, is heated to a partially melted state at a temperature higher than 1000° C. and is gradually cooled to disperse many and fine precipitates of the 211 phase in a superconductive phase, whereby a high-Jc material is prepared by which the foregoing problems are solved.

The most remarkable characteristic of the first aspect of the present invention is that a melt containing oxides of Y, Ba and Cu, i.e., the melt consisting of $Y_2O_3$ and the BaCu oxide phase (liquid phase), is rapidly cooled and solidified to obtain a formed body, e.g., a sheet, coil, wire or the like, having a thickness of less than 5 mm. In the formed body, grains of the $Y_2O_3$ phase having a diameter of less than 50 μm are uniformly distributed at a volume ratio of 20 to 40% in the BaCu oxide phase.

As the rapid cooling method, there can be mentioned the plasma spraying method, the laser irradiation method, and the hammer quenching method.

Next, the above formed body is subjected to a heat treatment at a temperature of 1000° to 1350° C., whereby the formed body is partially melted, and has a structure consisting of the 211 phase and BaCu oxide phase.

Next, the formed body is gradually cooling at a cooling rate of less than 200° C./hr, whereby a 123 phase containing a fine and uniform 211 phase is obtained.

It was found that the reason for this is that, when the 211 phase is grown by the reaction between $RE_2O_3$ and the BaCu oxide phase, acicular 211 fibers having a fineness of about 1 μm are formed in the 123 phase.

The 123 phase is unstable at a high temperature of more than 970° C. and is melt-decomposed into the 211 phase and the liquid phase (BaCu oxide). At a temperature of more than about 1250° C., the 211 phase is also decomposed into $RE_2O_3$ and the liquid phase. In the formed body heated at a high temperature, however, in the above-mentioned partially melted state the fibrous 211 phase absorbs the liquid phase, and therefore, the shape of the formed body is substantially retained. if the formed body in this partially melted state is gradually cooled, the 123 phase is formed by a peritectic reaction between the 211 phase and the liquid phase. The micro structure formed at this point is an aggregate of single crystals having a size of several mm, in which a fine 211 phase is contained. This 211 phase produces a pinning center whereby a high Jc can be obtained. Accordingly, in the material prepared according to the present invention, the quantities of high angle grain boundaries reduced the Jc are very low and a high Jc can be obtained in the absence of a magnetic field, and even in a high magnetic field, a Jc 1000 times higher than that measured in samples prepared by the conventional technique, i.g., the sintering process, can be obtained. Furthermore, in this preparation process, a formed body having a thickness smaller than 5 mm is once kept in the partially melted state at a temperature of 1000° to 1350° C., and since the formed body has an appropriate viscosity when heated at a high temperature, the formed body can be easily processed into an optional shape. Moreover, materials can be easily bonded to each other by keeping them in contact with each other.

The reason for limiting the thickness of the formed body is that, if the thickness exceeds 5 mm, an uneven distribution of the respective components becomes conspicuous in the partially melted state and a homogeneous material cannot be obtained. Therefore, the thickness is limited as mentioned above.

Also, for a support of a shape of the formed body, a lower limit of the above thickness is 0.5 mm.

The reason for limiting the temperature for heating the formed body is that, if the temperature is lower than 1000° C. a partial melting occurs but is quantitatively small, and the above-mentioned effect cannot be obtained, and that if the temperature is higher than 1350° C., the original shape of the formed body cannot be retained. This temperature is generally changed to some extent according to the kind of RE element and the composition charged in the heating atmosphere, and the temperature tends to shift to the high temperature side when the ion radius of the rare earth element is larger, the partial pressure of oxygen in the atmosphere is higher, or the amount of rare earth is greatly in excess.

The reason for limiting the rate of gradual cooling is that, if the gradual cooling rate is higher than 200° C./hr, the growth of crystal of the 123 phase is not satisfactory. By this heat treatment, a fine 211 phase is included in the superconductive phase, and therefore, the size of 211 phase is fine and the mechanical strength is improved.

Also, preferably the above gradual cooling rate is as long as possible and within a range at which the effect of the present invention is obtained, and therefore, a lower limit of the gradual cooling rate is 10° C./hr.

In accordance with the above process, precipitates of the 211 phase having a diameter of less than 20 μm (this diameter is finer than that of the second process of the present invention) are uniformly distributed at a volume ratio of 3-35% in the whole oxide material (211 phase and 123 phase).

Also, preferably the grain size of the 211 phase dispersed in the texture of the 123 phase or the grain of $Y_2O_3$ dispersed in the BaCu oxide is as small as possible, within a range at which the effect of the present invention can be obtained, and thus a lower limit of these precipitate and grain sizes, respectively, is 0.5 or 1.0 μm.

The gist of the second process of the present invention resides in a process for the preparation of a high-Jc material by which the foregoing problems are solved, in which a formed body, e.g., a sheet, coil, wire or the like, having a thickness of less than 5 mm, which is obtained by mixing $RE_2O_3$ and BaCu oxide, is heated at a temperature of 1000° C. to 1350° C. and is gradually cooled at rate of less than 200° C./hr, whereby a material having reduced quantities of grain boundaries and very close to a single crystal is obtained by utilizing a peritectic reaction from the high temperature side.

The most prominent characteristic of the above process of the present invention is that an oxide having a superconducting substance-forming composition, obtained by mixing $RE_2O_3$ with BaCu oxide, is used as the formed body and a superconductive phase containing a fine 211 phase, in which the number of cracks is reduced, is obtained by heat-treating this oxide. The inventors investigated the following three states as the state of the formed body before the heat treatment.

1. Molded body of $REBa_2Cu_3O_{7-y}$ phase powder
2. Powdery mixture of $RE_2BaCuO_5$ phase and BaCu oxide
3. Powdery mixture of $RE_2O_3$ and BaCu oxide As a result, it was found that, when a powdery mixture of $RE_2O_3$ and BaCu oxide is used as the molded body, the 123 phase in which the 211 phase having a grain size of less than 20 μm is uniformly distributed is obtained. It was also found that, in the obtained superconductive phase, the size of one crystal is as large as several mm and the number of cracks is reduced, and a superconductive material in which superconductively weak links are reduced is obtained.

BEST MODE OF CARRYING OUT THE INVENTION

The best mode of carrying out the present invention will now be described with reference to the following example.

EXAMPLE 1

A powder of $YBa_2Cu_3O_{7-y}$ phase, such as an oxide of Y, Ba and Cu, was used, an heated and melted, the melt then rapidly cooled by a hammer-quenching and solidified, and a sheet having a thickness of 2 mm, a width of 10 mm, and a length of 20 mm, i.e., a formed body, was obtained.

The results of the observation of the micro structure of this sheet are shown in FIG. 1(c). In this micro structure, grains of $Y_2O_3$ having a size smaller than 50 μm were dispersed at a volume ratio of 40% in a $BaCuO_2$ phase. The sheet was placed on a platinum net, and the following heat treatment was carried out in an oxygen current. The sheet was maintained at 1200° C. for 1 hour, the temperature was lowered to 900° C. at a rate of −30° C./hr, and the temperature was then lowered to room temperature at a rate of −100° C./hr. A sample was cut from the obtained sheet and the superconductive characteristics were determined to obtain the results shown below.

The microstructure of the sample:

The precipitates of the 211 phase having an average diameter of 1 μm were dispersed at a volume ratio of 15% in the whole oxide material (all phase and 123 phase).

Critical temperature (Tc):

A sharp superconductive transition was manifested at 93 K.

Figure 2:
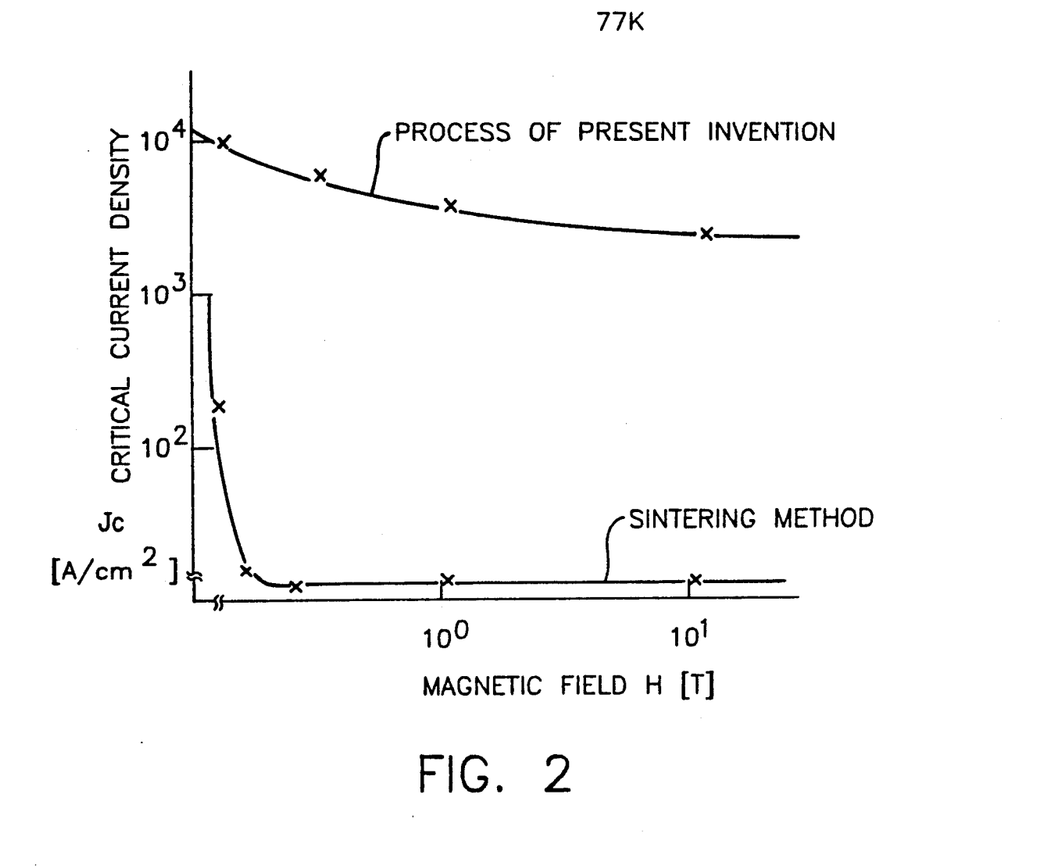
FIG. 2 is a diagram illustrating the magnetic field dependency of the critical current density at the liquid nitrogen temperature of 77 K.
Figure 3:
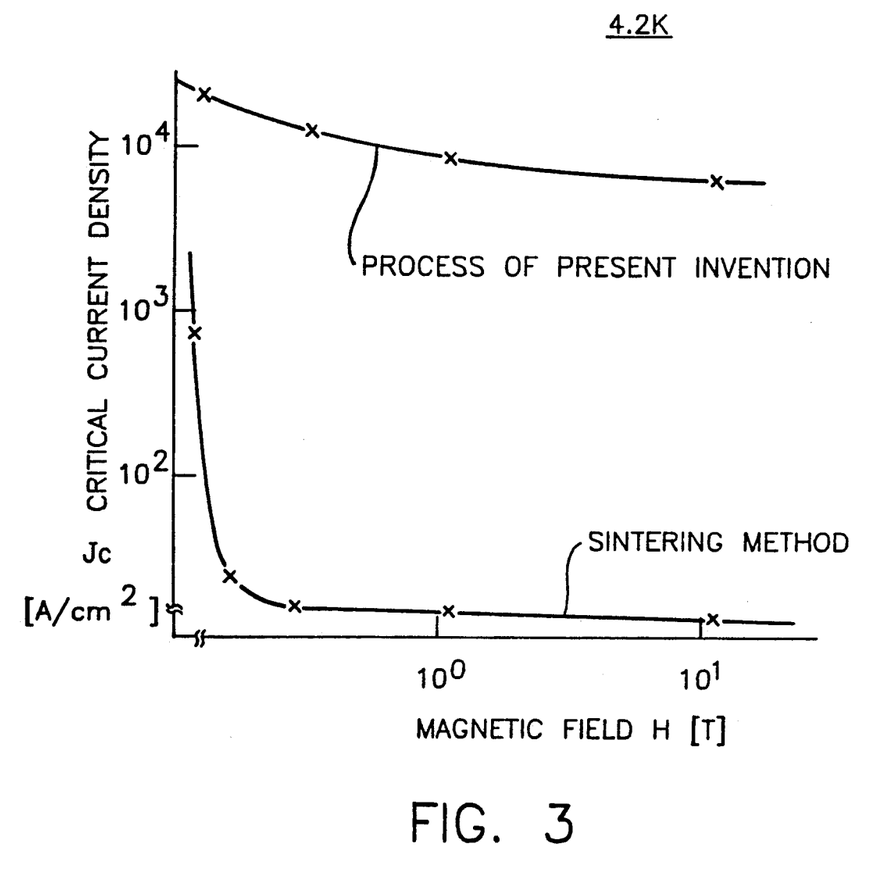
FIG. 3 is a diagram illustrating the magnetic field dependency of the Jc at the liquid helium temperature of 4.2 K.
Figure 4:
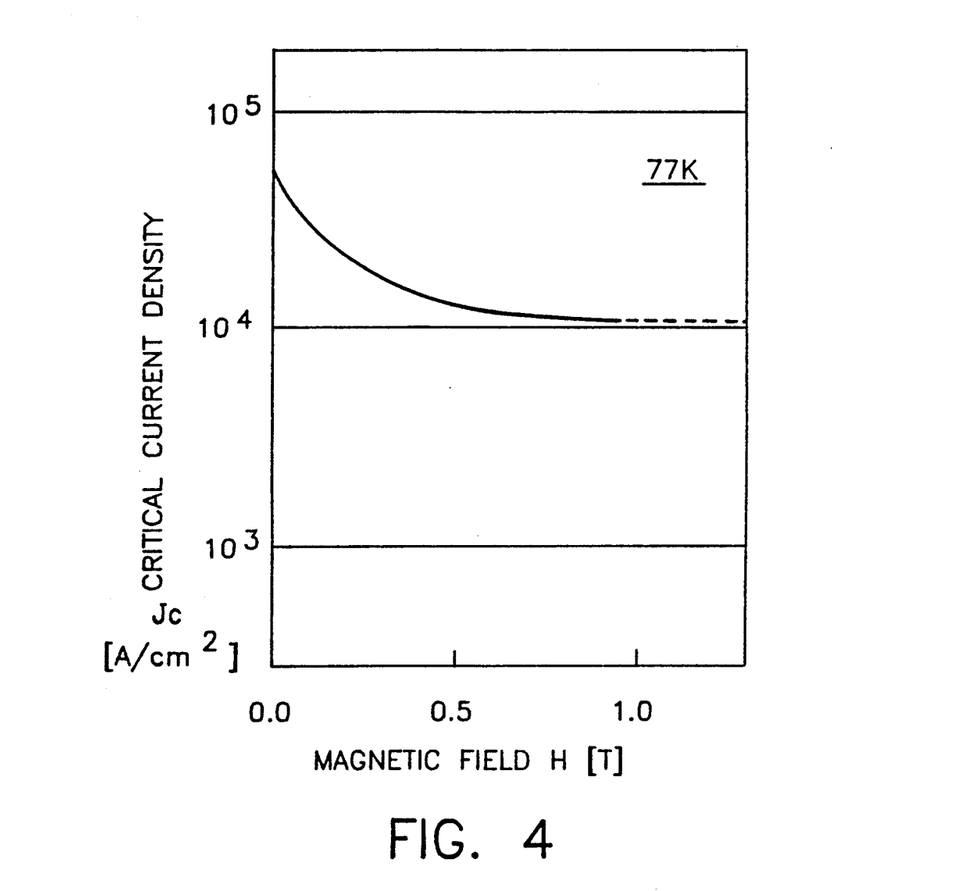
FIG. 4 shows the magnetic field dependency of the critical current density determined from the magnetization characteristics at 77 K.

Critical current density (Jc):

The transport critical current densities determined at 4.2 K. and 77 K. by the four-terminal method are shown in FIGS. 2 and 3 (the four-terminal method includes a risk of an underestimation of the Jc by a generation of heat at the current terminal). FIG. 4 shows the critical current density determined by the measurement of magnetization characteristics of another sample. It was confirmed that, in this case, a value larger than the value obtained by the four-terminal method was obtained.

As apparent from the foregoing results, the preparation process of the present invention is far superior to that of the conventional preparation process, in that a superconductive material having a high quality can be prepared.

When the experiment was similarly carried out in the state in which the sheet was placed on a bent platinum net, it was confirmed that a shape substantially the same as the shape of the net could be imparted to the superconductive material and the forming of the shape of the material was easy. When the experiment was similarly carried out in the state in which two sheets were partially piled, it was confirmed that the superconductivity was not substantially changed in the bonded portion, and that the bondability was very good.

In connection with the mechanical characteristics, from the results of the observation of the texture, it was found that large quantities of the 211 phase having a size of about 1 μm were present in the sheet, and the strain by the phase transition to the rhombic system from the tetragonal system was moderated without a formation of a twin crystal, and therefore, it was construed that the mechanical toughness was improved.

EXAMPLE 2

A BaO powder was mixed with a CuO powder and the mixed powder was heated at a temperature of 900° C. in an oxygen atmosphere, whereby a BaCu composite oxide was formed. The composite oxide was then mixed with a $Y_2O_3$ powder, in which an elemental rate of (Y:Ba:Cu) in the mixed powder was (129:214:314), i.e., a $Y_2BaCuO_5$ phase was contained at a volume rate of 20% in a structure of a $YBa_2Cu_3O_{7-y}$ phase of a final material.

After the mixed powder was formed into a pellet having a thickness of 1.5 mm a width of 4 mm and a length of 10 mm, the pellet was placed on a platinum net and the following heat treatment was carried out in an air atmosphere. Namely, the pellet was heated at a temperature of 1150° C. until it was partially melted, and then cooled to a temperature of 900° C. at a cooling rate of 15° C./hr in an oven.

An observation of the structure of the obtained material showed that the $YBa_2Cu_3O_{7-y}$ phase contained the fine $Y_2BaCuO_5$ phase having diameter of 10-1 μm and consisted of single crystals of a grain size of 2 to 3 mm.

The superconductive characteristics of the material, i.e., critical temperature (Tc) and critical current density (Jc), indicated a result of almost the same as in Example 1.

INDUSTRIAL APPLICABILITY

As apparent from the foregoing detailed description, an oxide superconductive material having a high quality not obtainable according to the conventional technique can be prepared according to the present invention, and this superconductive material can be broadly used in the formed product in various fields, and very high industrial effects can be obtained. The following examples can be mentioned.

1) Superconducting wire

According to the preparation process of the present invention, a wire having a high Jc can be prepared from a formed body, and the connection of this wire can be performed very easily. Accordingly, the wire can be used even as a long-distance power-transmission line.

2) Superconductive coil

A magnet having a high quality can be prepared only by piling many spiral formed bodies and heat-treating them in the state in which they are in contact with one another at the portions to be bonded.

3) Superconductive magnetic shielding material

A superconductive material having an optional shape can be prepared only by placing a sheet shaped formed body on a mold having an optional shape and heat-treating the molded body, and therefore, a high quality magnetic shielding material having a reduced flux leakage can be easily prepared.

We claim:

1. An oxide superconductive material having a high critical current density of greater than $10^4 A/cm^2$ at a temperature of 77 K. and an external magnetic field of 1 Tesla, consisting essentially of an oxide of Y, Ba and Cu, said material exhibiting a microstructure wherein precipitate of a $Y_2BaCuO_5$ phase, having a diameter of smaller than 20 μm, are dispersed in a single crystal of a $YBa_2Cu_3O_{7-y}$ phase, wherein the amount of the $Y_2BaCuO_5$ phase is from about 5% to about 35% by volume of the oxide superconductive material microstructure.

* * * * *